(12) United States Patent
Timopheev

(10) Patent No.: US 11,906,553 B2
(45) Date of Patent: Feb. 20, 2024

(54) MAGNETIC CURRENT SENSOR COMPRISING A MAGNETORESISTIVE DIFFERENTIAL FULL BRIDGE

(71) Applicant: Crocus Technology SA, Grenoble (FR)

(72) Inventor: Andrey Timopheev, Vif (FR)

(73) Assignee: CROCUS TECHNOLOGY SA, Grenoble (FR)

(*) Notice: Subject to any disclaimer, the term of this patent is extended or adjusted under 35 U.S.C. 154(b) by 221 days.

(21) Appl. No.: 17/597,352

(22) PCT Filed: Jun. 26, 2020

(86) PCT No.: PCT/IB2020/056067
§ 371 (c)(1),
(2) Date: Jan. 4, 2022

(87) PCT Pub. No.: WO2021/005447
PCT Pub. Date: Jan. 14, 2021

(65) Prior Publication Data
US 2022/0268815 A1 Aug. 25, 2022

(30) Foreign Application Priority Data
Jul. 5, 2019 (EP) .................................. 19315059

(51) Int. Cl.
*G01R 15/20* (2006.01)
*G01R 33/00* (2006.01)
*G01R 33/09* (2006.01)

(52) U.S. Cl.
CPC ....... *G01R 15/205* (2013.01); *G01R 33/0005* (2013.01); *G01R 33/098* (2013.01)

(58) Field of Classification Search
CPC .................. G01R 15/205; G01R 33/0005; G01R 33/098; G01R 15/207
(Continued)

(56) References Cited

U.S. PATENT DOCUMENTS

2017/0038437 A1   2/2017  Latham
2021/0063509 A1*  3/2021  Wang ..................... G11B 5/295
(Continued)

FOREIGN PATENT DOCUMENTS

EP    1566651 A1   8/2005

OTHER PUBLICATIONS

International Search Report for PCT/IB2020/056067 dated Sep. 4, 2020.
(Continued)

*Primary Examiner* — Giovanni Astacio-Oquendo
(74) *Attorney, Agent, or Firm* — DALY, CROWLEY, MOFFORD & DURKEE, LLP

(57) ABSTRACT

Magnetic current sensor, including: a sensor bridge circuit including a first and second half-bridges, each including two series-connected and diagonally opposed tunnel magnetoresistive (TMR) sensor elements, the TMR sensor elements including a reference layer oriented a single predetermined direction and a sense layer having a sense magnetization; a field line configured for passing a field current generating a magnetic field adapted for orienting the sense magnetization of the diagonally opposed TMR sensor elements of the first half-bridge and of the diagonally opposed TMR sensor elements of the second half-bridge in an opposite direction; such that a non-null differential voltage output between the TMR sensor elements of the first half-bridge and the TMR sensor elements of the second half-bridge is measurable when the field current is passed in the field line; the differential voltage output being insensitive to the presence of an external uniform magnetic field.

9 Claims, 5 Drawing Sheets

(58) Field of Classification Search
USPC .................................... 324/252, 244, 200
See application file for complete search history.

(56) References Cited

U.S. PATENT DOCUMENTS

2021/0293911 A1* 9/2021 Lassalle-Balier .... G01R 33/098
2023/0031975 A1* 2/2023 Maerz ................. G01R 33/093

OTHER PUBLICATIONS

Written Opinion for PCT/IB2020/056067 dated Sep. 4, 2020.
Boeve H. et al.: "Geometry Optimization of TMR Current Sensors for On-Chip IC Testing", IEEE Transactions on Magnetics, Oct. 2005, vol. 41, No. 10, pp. 3685-3687, IEEE Service Center, New York, NY, US, XP011140782.

* cited by examiner

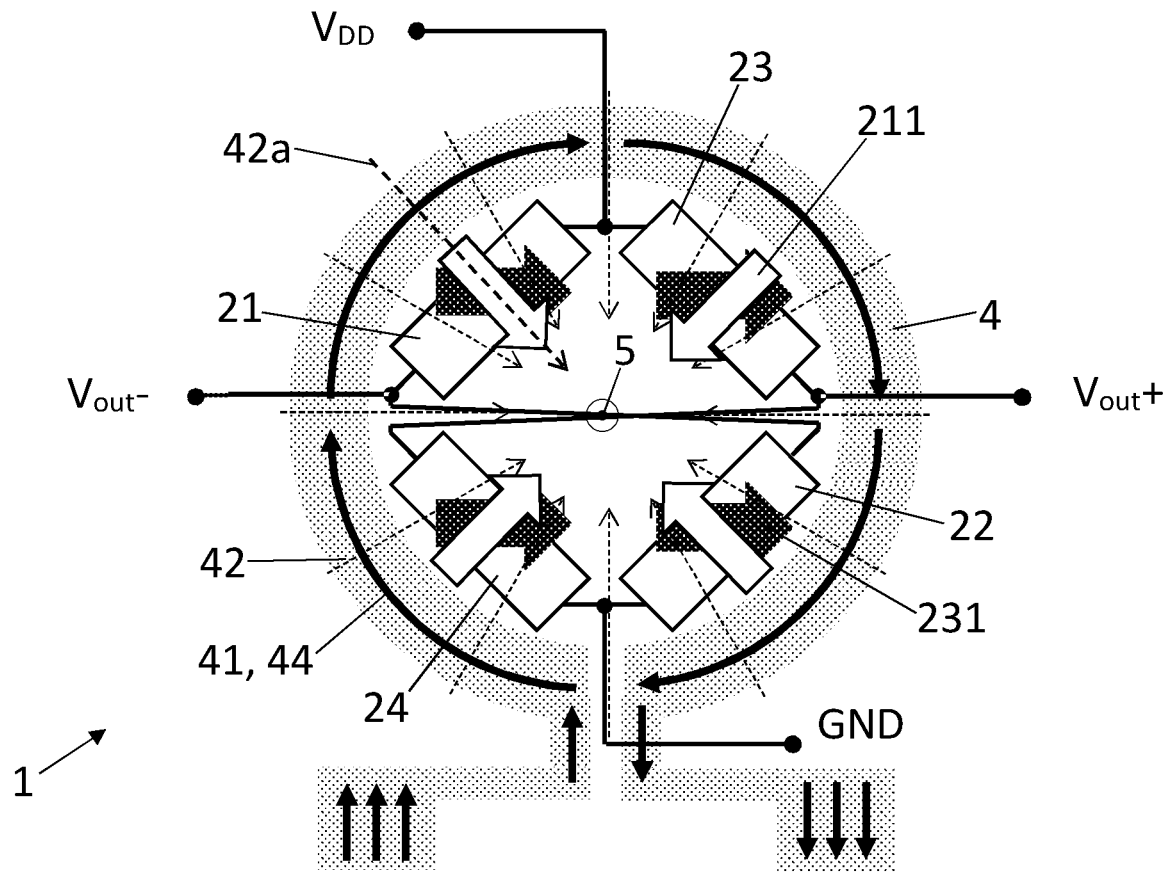
Fig. 4
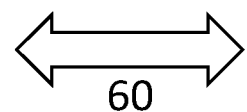

US 11,906,553 B2

MAGNETIC CURRENT SENSOR COMPRISING A MAGNETORESISTIVE DIFFERENTIAL FULL BRIDGE

FIELD

The present disclosure concerns a magnetic current sensor. More particularly, the present disclosure concerns a differential magnetic current sensor comprising a magnetoresistive differential full bridge. The magnetic current sensor does not require a differential thermal-assisted programming and is insensitive to the presence of an external uniform magnetic field.

DESCRIPTION OF RELATED ART

A conventional current sensor 1 based on tunnel magnetoresistive (TMR) sensors is schematically illustrated in FIG. 1. The current sensor 1 comprises a U-shaped current line 4, a first TMR sensor elements 21 in the vicinity of a first portion 4a of the current line 4 and aa second TMR sensor element 22 in the vicinity of a second portion 4b of the current line 4.

FIG. 2 shows a side views of the TMR sensor element 21, 22 comprising a tunnel barrier layer 220 sandwiched between a ferromagnetic reference layer 230 having a pinned reference magnetization 231, and a ferromagnetic sense layer 210 having a sense magnetization 211 that can be freely oriented in a magnetic field.

Referring again to FIG. 1, the first TMR sensor elements 21 has its reference magnetization 231 pinned in a first direction and the second TMR sensor element 22 has its reference magnetization 231 pinned in a second direction opposed to the first direction. By passing a field current 41 in the current line 4, the field current 41 flowing in the first portion 4a induces a first sensing magnetic field 42a oriented opposite to the second sensing magnetic field 42b induced by field current 41 flowing in the second portion 4b. Thus, depending on the polarity of the field current 41 passing in the current line 4, the sense magnetization 211 of the first and second TMR sensor elements 21, 22 are oriented either antiparallel to the reference magnetization 231, increasing the resistance of the two TMR sensor elements 21, 22, or parallel to the reference magnetization 231, decreasing the resistance of the two TMR sensor elements 21, 22.

In the presence of a uniform external magnetic field, represented by the arrow 60 in FIG. 1, the sense magnetization 211 of the first and second TMR sensor elements 21, 22 are oriented antiparallel and parallel to the reference magnetization 231, depending on the orientation of the external magnetic field 60. Consequently, the electrical conductance of one of the TMR sensor elements 21, 22 is increased while the electrical conductance of the other TMR sensor elements 21, 22 is decreased. The summed resistance of the two TMR sensor elements 21, 22 is unchanged by the orientation of the external magnetic field 60.

The current sensor 1 is thus insensitive to the external magnetic field 60 and proportional to the first and second sensing magnetic field 42a, 42b generated by the field current 41 passing in the current line 4.

However, the conventional current sensor 1 requires to program the reference magnetization 231 of the first and second TMR sensor elements 21, 22 in two opposed directions. The programming is a thermally assisted procedure: each sensor element is heated up and then cooled down under presence of magnetic field. Magnetic field direction defines pinning direction of their reference layer magnetization 231. The sensor programming implies two magnetic field directions for each device. Such programming can be done only device by device which limits bandwidth of mass production.

Moreover, the presence of an orthogonal component of the sensing magnetic field generated by the field current 41 in the curved part 4c of the current line 4 can distort the linearity of the current sensor 1.

SUMMARY

The present disclosure concerns a magnetic current sensor, comprising: a sensor bridge circuit including a first half-bridge comprising two series-connected and diagonally opposed TMR sensor elements, and a second half-bridge comprising two series-connected and diagonally opposed TMR sensor elements; each TMR sensor element comprising a tunnel barrier layer, a reference layer having a pinned reference magnetization and a sense layer having a sense magnetization that can be freely oriented; the TMR sensor elements having their reference magnetization oriented substantially in the same direction; a field line configured to pass a field current generating a magnetic field adapted for orienting the sense magnetization of the diagonally opposed TMR sensor elements of the first half-bridge is oriented along the direction of the magnetic field and in a direction opposite to the diagonally opposed TMR sensor elements of the second half-bridge; such that a non-null differential voltage output between the TMR sensor elements of the first half-bridge and the TMR sensor elements of the second half-bridge is measurable when the field current is passed in the field line; the differential voltage output being insensitive to the presence of an external uniform magnetic field. The pinning direction in each of the TMR sensor elements is oriented at about 45° relative to a tangent line of the field line.

The magnetic current sensor does not require a differential thermal-assisted programming and is insensitive to the presence of an external uniform magnetic field.

BRIEF DESCRIPTION OF THE DRAWINGS

The invention will be better understood with the aid of the description of an embodiment given by way of example and illustrated by the figures, in which:

FIG. 4 illustrates a magnetic sensing device comprising the sensor bridge circuit, according to an embodiment;

DETAILED DESCRIPTION OF POSSIBLE EMBODIMENTS

Figure 1:
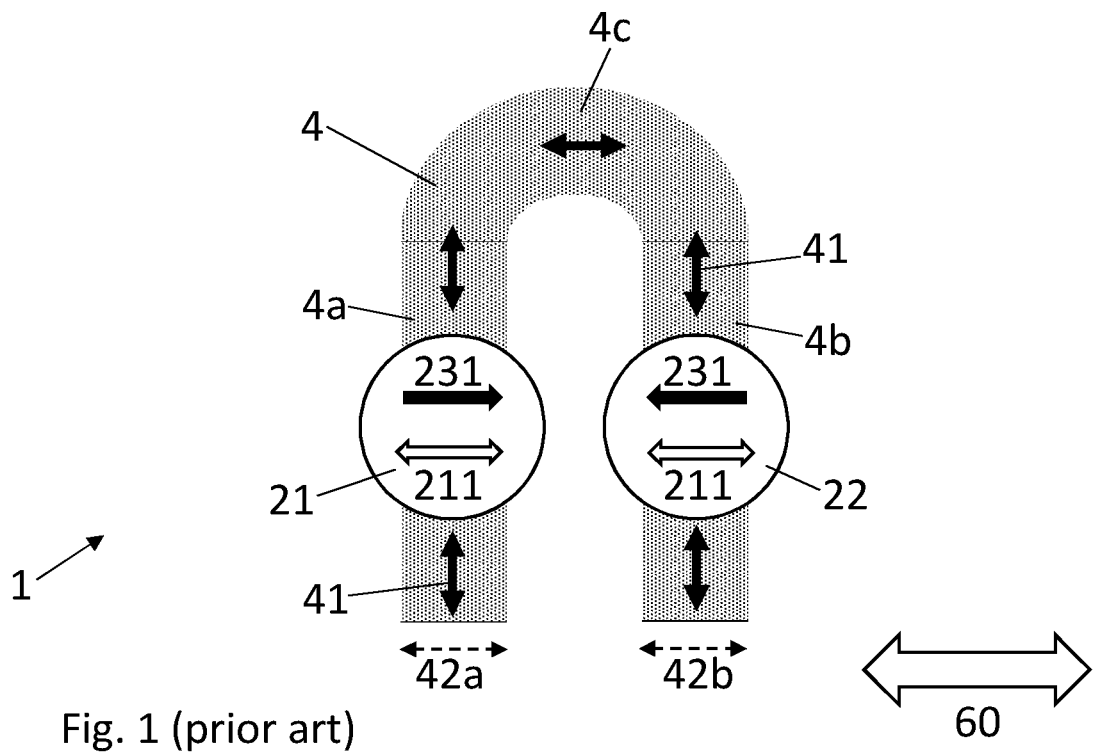
FIG. 1 schematically illustrates a conventional magnetic field sensor comprising two TMR sensor elements.
Figure 2:
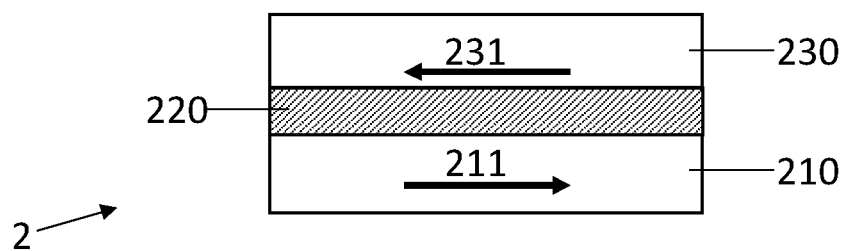
FIG. 2 shows a side views of a TMR sensor element.
Figure 3:
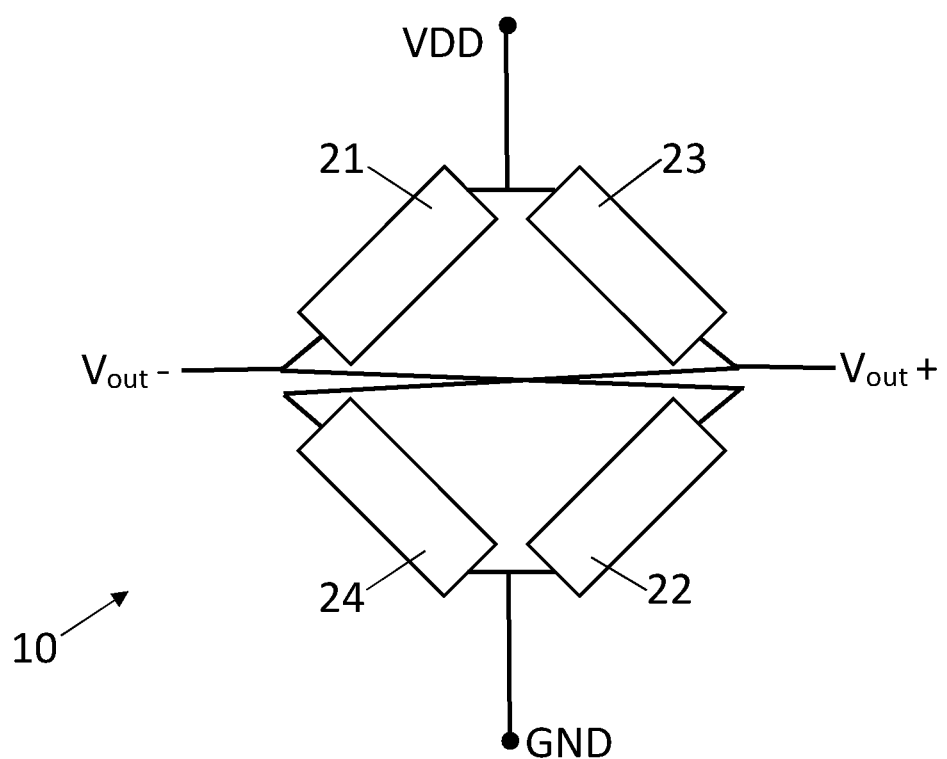
FIG. 3 shows a sensor bridge circuit comprising two half-bridges, each including two series-connected TMR sensor elements.

FIG. 3 shows a sensor bridge circuit 10 having a first half-bridge containing two series-connected tunnel magnetoresistive (TMR) sensor elements 21, 22, and a second half-bridge containing two series-connected TMR sensor elements 23, 24. The sensor elements 21-24 are arranged such as to form a Wheatstone bridge. The TMR sensor element 21-24 has the structure represented in FIG. 2 comprising a tunnel barrier layer 220 sandwiched between a ferromagnetic reference layer 230 having a pinned reference magnetization 231, and a ferromagnetic sense layer 210 having a sense magnetization 211 that can be freely oriented. The reference magnetization 231 has a predetermined pinning direction 232 that is substantially identical for each of the TMR sensor elements. The pinning direction 232 corresponds to the sensing axis in the first and second half-bridge.

FIG. 4 illustrates a magnetic current sensor 1 comprising the sensor bridge circuit 10, according to an embodiment. The magnetic current sensor 1 comprises a field line 4 configured to pass a field current 41 and generate a magnetic field 42 adapted for varying the orientation of the sense magnetization 211. The field line 4 forms a circular loop around the sensor bridge circuit 10. The circular field line 4 generates a radial magnetic field 42, such that the magnetic field 42 is oriented in a symmetrical fashion about a central point of the sensor bridge circuit 10. Here, the central point is represented by the circle 5 and corresponds to the geometric center of the circular field line 4.

In the example of FIG. 4, the pinning direction 232 in each of the TMR sensor elements 21-24 of the sensor bridge circuit 10 is oriented at about 45° relative to the average direction (represented by the arrow 42a) of the radial magnetic field 42. Thus, the radial magnetic field 42 generated by the circular field line 4 orients the sense magnetization 211 of the first half-bridge sensor element 21 and the second half-bridge sensor element 23 in a direction opposite to the one of the sense magnetization 211 of the first half-bridge sensor element 22 and the second half-bridge sensor element 24, respectively.

Since the pinning direction 232 of the reference magnetization 231 is substantially identical for each of the TMR sensor elements, the magnetic current sensor 1 does not require a differential thermal-assisted programming, whereby a subset of the TMR sensor elements 21-24 is heated and the corresponding reference magnetization 231 programmed in a first direction and another subset of the TMR sensor elements 21-24 is heated and the corresponding reference magnetization 231 programmed in a second direction that differs from the first direction.

In particular, the radial magnetic field 42 orients the sense magnetization 211 of the TMR sensor elements 21 and 24 more parallel to the reference magnetization 231, decreasing the resistance of these two TMR sensor elements 21, 24. The radial magnetic field 42 orients the sense magnetization 211 of the TMR sensor elements 22 and 23 more antiparallel to the reference magnetization 231, increasing the resistance of these two TMR sensor elements.

Consequently, when the field current 41 is passed in the circular field line 4, a voltage output $V_{out-}$ is measurable between the TMR sensor elements 21 and 22 of the first half-bridge and a voltage output $V_{out+}$ is measurable between the TMR sensor elements 23 and 24 of the second half-bridge. The sensor bridge circuit 10 thus forms a differential configuration, or a voltage divider configuration.

As can be seen from FIG. 4, the sense magnetization 211 is oriented by the magnetic field 42 in the same direction as the magnetic field 42. Thus, the sense magnetization 211 and the magnetic field 42 makes substantially the same angle relative to the direction of the pinned reference magnetization 231 for each TMR sensor element 21-24.

In one aspect, the ferromagnetic sense layer 210 is configured such that the sense magnetization 211 comprises a stable magnetization vortex configuration. For the external magnetic field being lesser than the vortex cancellation field, the vortex configuration exists, and its vortex core is moved elastically and reversibly in the plane of the ferromagnetic sense layer 210.

In a preferred configuration, each TMR sensor element 21-24 has a linear response for a given amplitude range of the field current 41 is passed in the field line 4. In other words, in that given amplitude range the resistance of the TMR sensor elements 21-24 varies linearly with field current 41. The voltage output $V_{out-}$ and $V_{out+}$ is then proportional to the amplitude variation of the field current 41.

Since the reference magnetization 231 is programmed in the same predetermined pinning direction 232 for all TMR sensor elements 21-24, the magnetic current sensor 1 is insensitive to a uniform external magnetic field 60. Indeed, the sense magnetization 211 of the TMR sensor elements 21-24 is oriented according to the direction the uniform external magnetic field 60, resulting in all the TMR sensor elements 21-24 having the same resistance. Consequently, the magnetic current sensor 1 produces no measurable voltage output $V_{out-}$ and $V_{out+}$ in the presence of the external magnetic field. In other words, the differential voltage output $-V_{out}$ and $V_{out}$ is insensitive to the presence of an external uniform magnetic field 60.

Programming the reference magnetization 231 in the same predetermined pinning direction 232 for all TMR sensor elements 21-24 can be achieved in one single step by heating and cooling down the whole wafer in presence of the magnetic field.

In a preferred configuration, the TMR sensor elements 21-24 are arranged equidistant to the central point 5, such that each TMR sensor element 21-24 of the sensor bridge circuit 10 is exposed to substantially the same magnitude of the magnetic field 42. In this configuration, the measurable voltage output $V_{out-}$ and $V_{out+}$ of the magnetic current sensor 1 is determined by the sole variation in the orientation of the magnetic field 42 from one TMR sensor element 21-24 to another.

Figure 5:
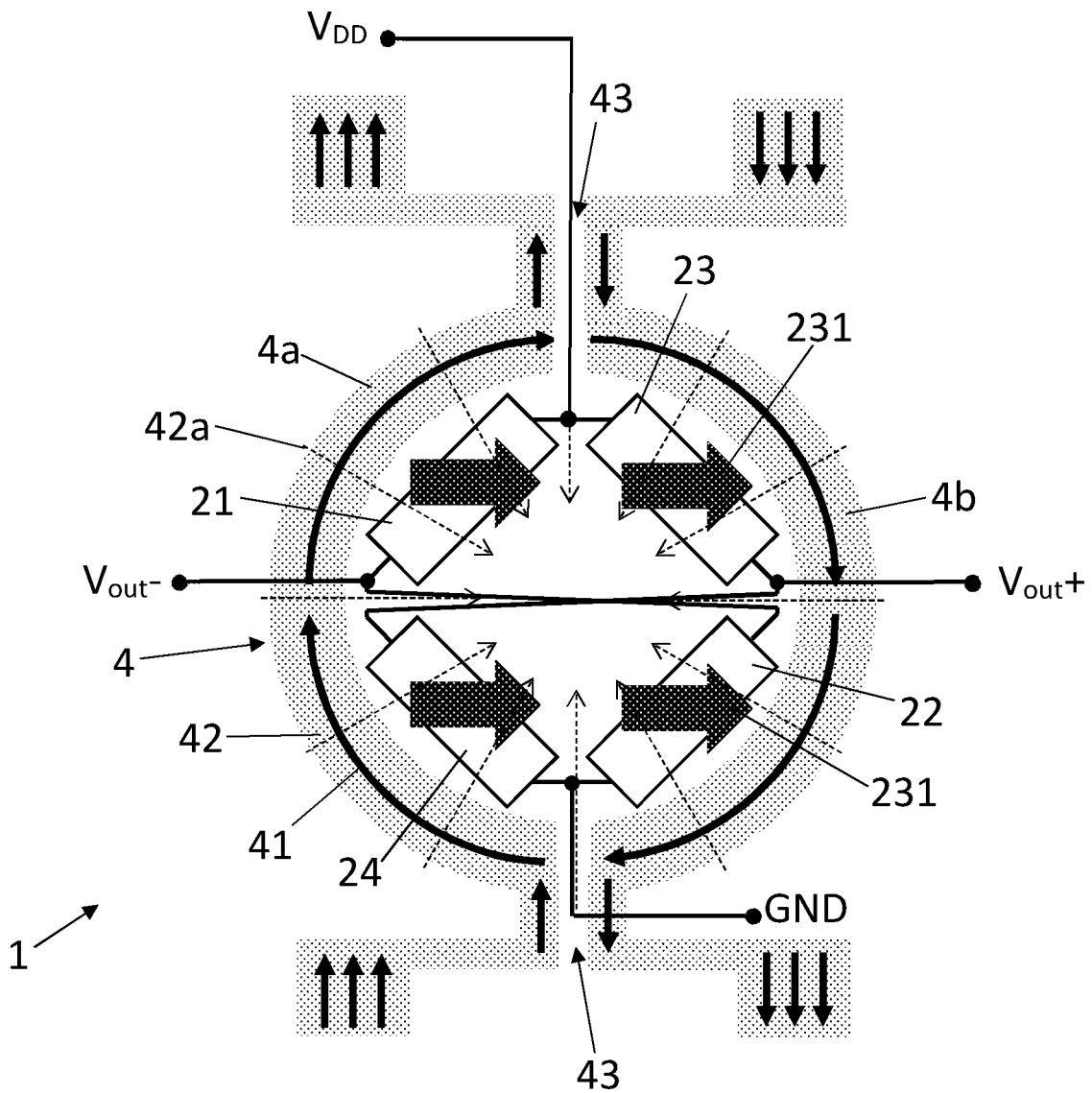
FIG. 5 illustrates a magnetic sensing device, according to another embodiment.

FIG. 5 illustrates the magnetic current sensor 1, according to another embodiment, wherein the circular field line 4 comprises a first portion 4a and a second portion 4b electrically isolated from the first portion 4a. In the example, the circular field line comprises symmetrical first and second field line portions 4a, 4b including an insulating gap 43 at tow opposite portion of the circular field line 4. The field line 4 arrangement of FIG. 5 is more symmetrical that the one of FIG. 4.

For both configurations of FIGS. 4 and 5, the sensor bridge circuit 10 is preferably arranged concentric with the field line 4 (and with the central point 5).

Figure 6:
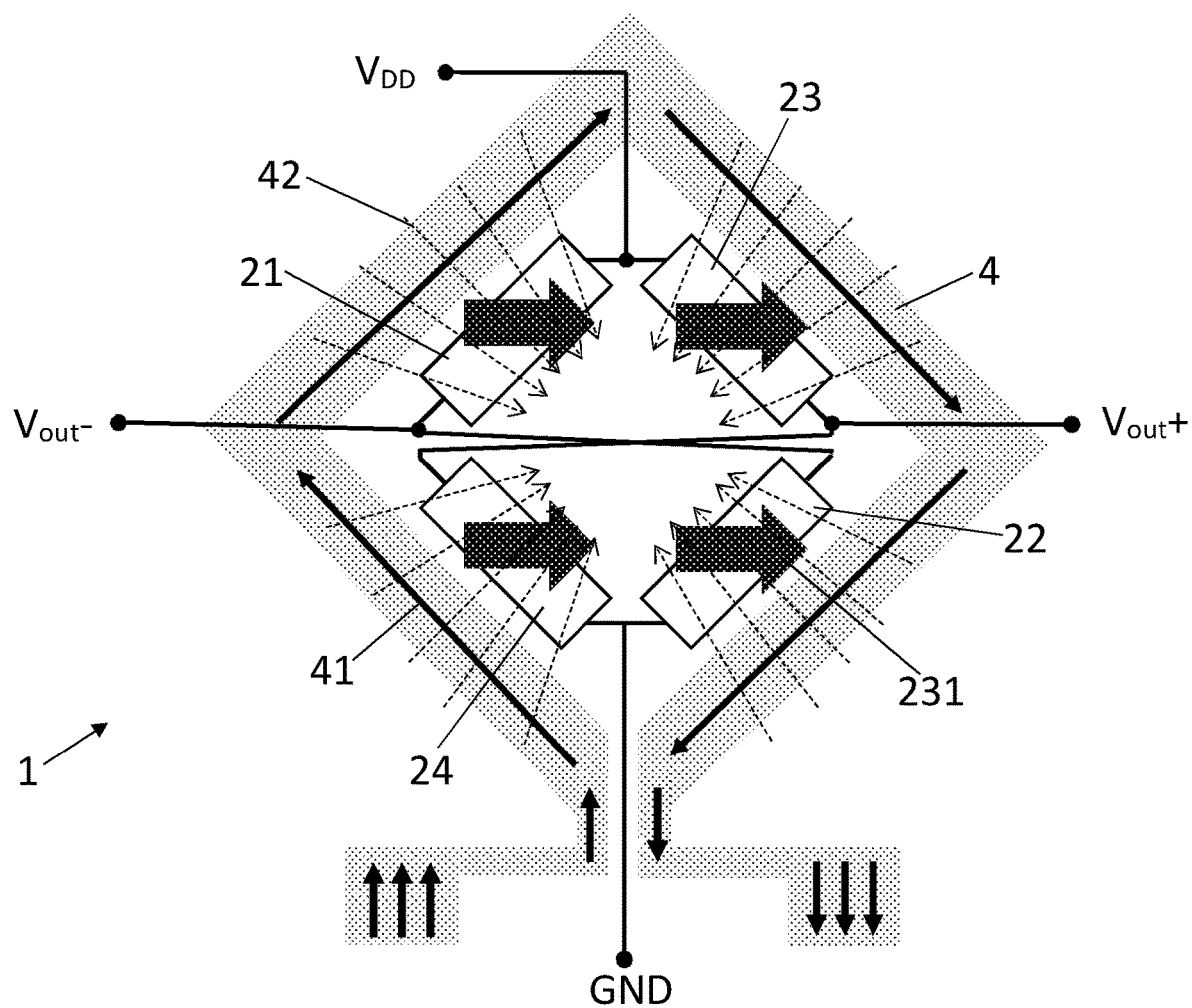
FIG. 6 illustrates a magnetic sensing device, according to yet another embodiment.

FIG. 6 illustrates the magnetic current sensor 1, according to yet another embodiment, wherein the field line 4 is configured to forms a quadrate. In this configuration of the field line 4, the magnetic field 42 is directed substantially orthogonal to the TMR sensor elements 21-24 of the sensor bridge circuit 10. The radial gradient within each TMR sensor elements 21-24 is thus smaller since the magnetic field 42 is more uniform. should give better sensitivity.

It is understood that the present invention is not limited to the exemplary embodiments described above and other examples of implementations are also possible within the scope of the patent claims.

For example, the field line 4 can be arranged within the sensor bridge circuit 10 or in any other configuration, provided that the magnetic field 42 generated by the circular field line 4 orients the sense magnetization 211 of the first half-bridge sensor element 21 and the second half-bridge sensor element 23 in a direction opposite to the one of the sense magnetization 211 of the first half-bridge sensor element 22 and the second half-bridge sensor element 24, respectively.

Preferably, the magnetic field 42 is oriented in a symmetrical fashion about a central point of the sensor bridge circuit 10.

The centrosymmetric arrangement of the magnetic current sensor 1 allows for combining the sensor bridge circuit 10 with different sizes of the field line 4. For example, the diameter of the circular field line 4 or the side of the quadrate field line 4 can be increased when higher field current 41 need to be used. The portion of the die within the inner diameter of the circular field line 4, into which the sensor bridge circuit 10 is fabricated, can remain unchanged.

REFERENCE NUMBERS AND SYMBOLS 1 magnetic sensing device
10 sensor bridge circuit
2 magnetic tunnel junction
21, 22 TMR sensor element
23, 24 TMR sensor element
210 sense layer
211 sense magnetization
220 tunnel barrier layer
230 reference layer
231 reference magnetization
232 pinning direction
4 current line
4a first portion of the current line
4b second portion of the current line
4c curved part of the current line
41 field current
42 sensing magnetic field
43 insulating gap
44 programming current
5 central point
60 external magnetic field

The invention claimed is:

1. Magnetic current sensor, comprising:
a sensor bridge circuit comprising:
  a first half-bridge comprising two series-connected and diagonally opposed tunnel magnetoresistive (TMR) sensor elements; and
  a second half-bridge comprising two series-connected and diagonally opposed TMR sensor elements,
  each TMR sensor element comprising a tunnel barrier layer, a reference layer having a pinned reference magnetization and a sense layer having a sense magnetization that can be freely oriented, the TMR sensor elements having their reference magnetization oriented substantially in the same direction; and
a field line configured to pass a field current generating a magnetic field such that the sense magnetization of the diagonally opposed TMR sensor elements of the first half-bridge is oriented along the direction of the magnetic field and in a direction opposite to the diagonally opposed TMR sensor elements of the second half-bridge,
wherein a non-null differential voltage output between the TMR sensor elements of the first half-bridge the TMR sensor elements of the second half-bridge is measurable when the field current is passed in the field line,
wherein the differential voltage output is insensitive to the presence of an external uniform magnetic field, and
wherein the pinning direction in each of the TMR sensor elements is oriented at about 45° relative to a tangent line of the field line.

2. Magnetic sensing circuit according to claim 1, wherein the sensor bridge circuit forms a Wheatstone bridge.

3. Magnetic sensing circuit according to claim 2, wherein the field line is configured such that the magnetic field is directed symmetrical about a central point in the center of the sensor bridge circuit.

4. Magnetic sensing circuit according to claim 3, wherein the field line forms a circular loop.

5. Magnetic sensing circuit according to claim 4, wherein the field line comprises a first portion and a second portion electrically isolated from the first portion.

6. Magnetic sensing circuit according to claim 5, wherein the first portion and the second portion are symmetrical.

7. Magnetic sensing circuit according to claim 3, wherein the TMR sensor elements are equidistant to a said central point, such that each TMR sensor element is exposed to substantially the same magnitude of the magnetic field.

8. Magnetic sensing circuit according to claim 2, wherein the field line forms a quadrate.

9. Magnetic sensing circuit according to claim 8, wherein the field line is configured such that the magnetic field is directed substantially orthogonal to the sensor elements of the sensor bridge circuit.

* * * * *